(12) United States Patent
Nauts et al.

(10) Patent No.: US 6,519,743 B1
(45) Date of Patent: Feb. 11, 2003

(54) METHOD AND SYSTEM FOR TIMING AND AREA DRIVEN BINARY AND/OR MATCHING

(75) Inventors: Claire Nauts, Grasse (FR); Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 10 days.

(21) Appl. No.: 09/645,778

(22) Filed: Aug. 24, 2000

(51) Int. Cl.[7] ................................................ G06F 17/50
(52) U.S. Cl. ...................................... 716/3; 716/2; 716/7
(58) Field of Search ................................ 364/488, 489, 364/490, 491; 716/1–2, 3, 6, 7, 8, 10

(56) References Cited

U.S. PATENT DOCUMENTS

| | | | | |
|---|---|---|---|---|
| 3,617,714 A | * | 11/1971 | Kernighan et al. ............ | 716/1 |
| 5,202,840 A | * | 4/1993 | Wong ........................... | 716/12 |
| 5,251,147 A | * | 10/1993 | Finnerty ........................ | 716/6 |
| 5,751,596 A | * | 5/1998 | Ginetti et al. .................. | 716/18 |
| 5,787,010 A | * | 7/1998 | Schaefer et al. ............... | 716/7 |
| 6,216,252 B1 | * | 4/2001 | Dangelo et al. ............... | 716/1 |
| 6,378,116 B1 | * | 4/2002 | Ginetti ............................ | 716/7 |
| 6,405,345 B1 | * | 6/2002 | Ginetti ............................ | 716/2 |

OTHER PUBLICATIONS

Narayan et al., "Reachability analysis using partitioned-ROBDDs", 1997 IEEE/ACM International Conference on Computer-Aided Design, Nov. 9, 1997, pp. 388–393.*

Kim et al., "Development of technology mapping algorithm for CPLD under time constraint", 6th International Conference on VLSI and CAD, Oct. 26, 1999, pp. 411–414.*

Cabodi et al., "Improving the efficiency of BDD–based operators by means of partitioning", IEEE Transactions on Computer–Aided Design of Integrated Circuits and Systems, vol. 18, No. 5, May 1999, pp. 545–556.*

\* cited by examiner

*Primary Examiner*—Vuthe Siek
*Assistant Examiner*—Phallaka Kik
(74) *Attorney, Agent, or Firm*—Crosby, Heafey, Roach & May; John W. Carpenter

(57) ABSTRACT

A method and system are disclosed for finding the best match from a target library of simple logic cells for a complex logic circuit conception. The inventive method is flexible and can be adapted to several cost functions or criteria. The inventive method finds the best children nodes for a match of simple gates (AND, OR, NAND, NOR). The method allows one to improve the overall area of the final design while respecting the time constrains. It also allows one to smartly speed up the tiler process as this process does not have to investigate exhaustive lists of possible children. Two preferred embodiments are disclosed. One such embodiment is designed to improve slack time and the other is designed to minimize required area.

19 Claims, 11 Drawing Sheets

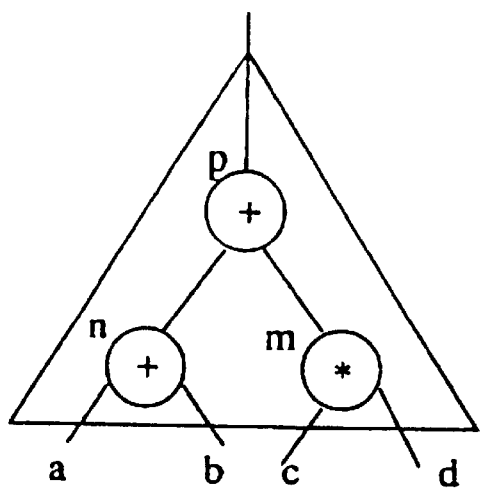

match1: gate: 2-input or
    output polarity: direct
    gate output: o
    child Nodes: a b
    child node polarity: direct direct
    gate inputs: i1 i2 match2: gate: 2-input and
    output polarity: invert
    gate output: o
    child Nodes: a b
    child node polarity: invert invert
    gate inputs: i1 i2 match3: gate: dual 2-input or
    output polarity: direct invert
    gate output: o ob
    child Nodes: a b
    child node polarity: direct direct
    gate inputs: i1 i2

FIG. 2

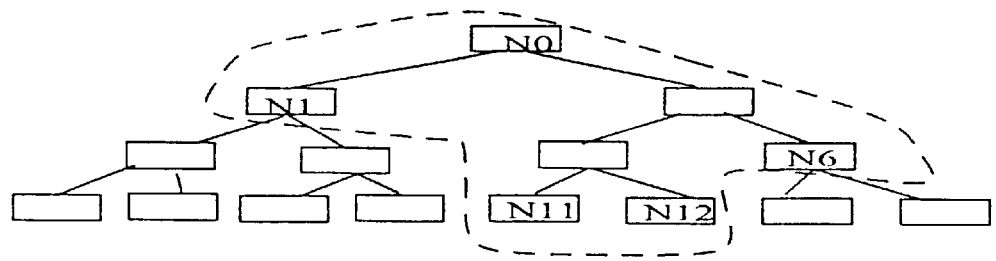
FIG. 5d
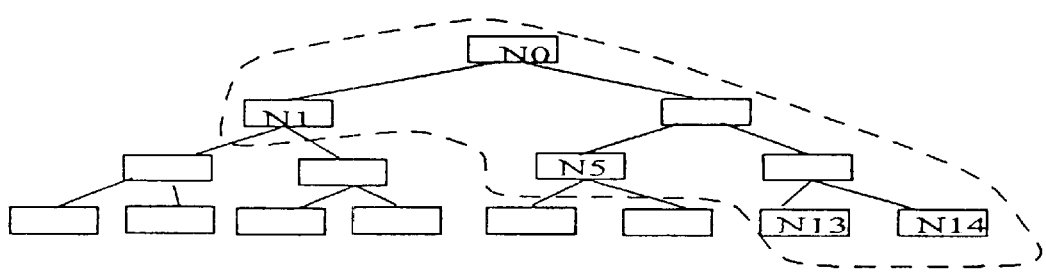
FIG. 5e
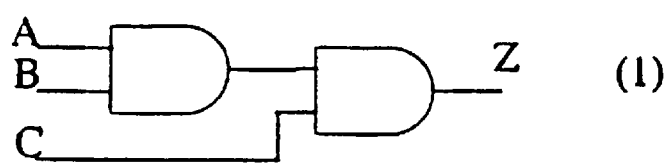 (1) FIG. 6a
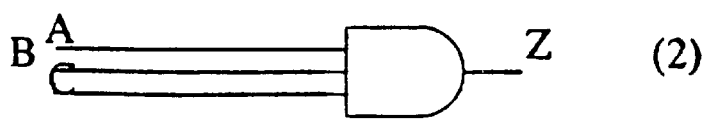 (2) FIG. 6b the selected match is : (n11 a b e n8)

Solution(1)
Logic cone is tiled
with 3 gates
area cost = 10

Solution (2)
Logic cone is tiled
with 4 gates
area cost = 11

Solution(3)
Logic cone is tiled
with 3 gates
area cost = 10

Solution(4)
Logic cone is tiled
with 4 gates
area cost = 11

| (3) n1.rigth |
|---|
| (4) n1.left |
|  |
|  |

| h |
|---|
| (2)n3.left |
| (4)n1.left |
|  |

| f |
|---|
| g |
| h |
| n2 |

METHOD AND SYSTEM FOR TIMING AND AREA DRIVEN BINARY AND/OR MATCHING

BACKGROUND OF THE INVENTION

1. Field of the Invention

The present invention relates generally to the field of computer-based logic synthesis for converting a logic circuit design into a representation based upon cells of a target library. The invention relates more specifically to a method for finding the best children nodes for a match of simple gates while improving overall area and respecting time constraints by minimizing slack.

2. Background Art

Today's logic circuits are so complex that they require computer-based techniques to help designers in their task. The flow of conception takes advantage of several techniques to transform an abstract representation of a design into a technology-dependant netlist (representation of the same design using cells of a target library). During this flow, techniques like behavioral synthesis, floor planning, placement, . . . are used. The invention focuses on one of the techniques called Logic Synthesis. Logic Synthesis takes an abstract representation of the design made of combinatorial blocks (single-output, multiple-input boolean equations) described by Directed Acyclic Graphs (DAG) and separated by sequential states. These DAGs are also often called Boolean Zones. Logic Synthesis performs abstract optimizations on the combinatorial and sequential parts and maps these parts on the target library. The Technology Mapper is in charge of taking a boolean zone and mapping it into the target library by covering boolean nodes with library cells.

Technology mapping is often done in four steps: In a first step, it partitions the Boolean Zone into a set of interconnected Logic Cones and Buffer Trees. A Logic Cone is defined as set of fanout-free interconnected 2-input AND gates and 2-input OR gates delimited by multi-fanout nodes, inverters, and buffers. A Buffer tree is a set of interconnected inverters, buffers (sometimes reduced to a simple multi-fanout wire) delimited by 2-input AND gates, 2-input OR gates and by Boolean Zone terminals. For instance, in FIG. 1, the Boolean Zone of FIG. 1a has been partitioned into three Logic Cones and Buffer trees as shown in FIG. 1b.

In a second step, the Logic Cones and the Buffer Trees are sorted in a Forward BFS (Breadth First Search) order.

In a third step, the Logic Cones are tiled one by one, respecting the sorting done in the second step. During the Tiling, the inputs of a Logic Cone are assumed to be available both in direct and inverted form. Also, the Tiling tries to tile the Logic Cone both in direct and inverted form, the best ones being kept. At each node, it iterates through all the library available cells and asks the Matcher if the current cell can cover the current node. The task of the Matcher is to analyze whether that covering is possible either in direct or inverted form. If the answer is affirmative, the Matcher produces the correspondence between the current cell inputs terminals and the frontier nodes driving that current cell as well as the polarity of these terminals. When the tiler reaches the root node of a logic cone, it selects the best cover for that logic cone. That selection induces a polarity on that logic cone, as well as on all the logic cone input terminals.

In a fourth step, the buffer trees are buffered one by one, respecting the logic cone input and output polarities specified by the tiler.

Definition

The Logic Cone Tiler visits the logic cone nodes in a BFS order from the inputs to the output. At each node, in a first phase, the Logic Cone Tiler first invokes the matcher with a given matchable library cell. The matcher produces a list of matches, each of which being composed of the following information:

the matched cell, that is the library cell it could match to the current node;

the polarity of the match of the appropriate gate output connector;

the children nodes reached by that match;

the correspondence between the children nodes and the gate input connectors;

the polarity of each of the children nodes.

For instance, in the case of the FIG. 2, the matcher invoked for the node n would produce a set of information such as the one presented in FIG. 2.

Expandable node: Operator Node of a Logic Cone that has the same function as its father.

Reachable children: Set of all the deepest nodes of a Logic Cone that can be covered by expandable nodes.

Slack: Difference between the original network required time and the best mapping arrival time. The slack information is computed by the tiler each time a cover is selected. As the Tiler is working on a bottom-up approach, this slack information is always available to the matcher.

Theory of Operation

The Three Main Phases of Binary AND/OR Matching

The matching is performed in three separate phases:

First phase is to verify whether the match is feasible or not. For simple cells (AND, OR, NAND, NOR) we just have to verify that the number of inputs is less than the size of the reachable children list.

Second phase is to find the children. It will be seen below that the Binary AND/OR matcher can either find several possible matches, or select one. Note that during this phase we do not need to know the function of the cell we are matching.

Third phase is the polarity assignment. We now need to know the exact function of the gate in order to assign the polarities on the outputs and on the inputs.

| Gate | Logic Node | Output Polarity | Input Polarities |
|---|---|---|---|
| And | And | Direct | Direct |
|  | Or | Inverted | Inverted |
| Nand | And | Inverted | Direct |
|  | Or | Direct | Inverted |
| Or | And | Inverted | Inverted |
|  | or | Direct | Direct |
| Nor | And | Direct | Inverted |
|  | Or | Inverted | Direct |

Selecting The Best Match

For a given cell, on a given node of the Logic Cone, we can have several matches, depending on the list of children we are going to choose as shown in FIG. 3.

To select the 'best' match, we need to identify the 'best' children.

If the boolean Matcher does not select a match, the tiler will eventually have the choice of a list of many different children. Just to give an idea of the number of possibilities:

| #nb of reachable children | 2-inputs gate | 3 inputs gate | 4 inputs gate | 5 inputs gate | 6 inputs gate | 7 inputs gate | 8 inputs gate | 9 inputs gate |
| --- | --- | --- | --- | --- | --- | --- | --- | --- |
| 4 | 1 | 2 | 1 | — | — | — | — | — |
| 8 | 1 | 2 | 5 | 6 | 6 | 4 | 1 | — |
| 16 | 1 | 2 | 5 | 14 | 26 | 44 | 69 | 94 |

Note that the problem of the gate pin assignment is not addressed here, but can be handled by the tiler through symmetry classes.

SUMMARY OF THE INVENTION

While the background art describes an algorithm where either the first list of children identified is returned to the tiler, or all the lists (exhaustive approach) are returned to the tiler, the present invention address the shortcomings of the background art by providing a method for finding the best match from a target library of simple logic cells for a complex logic circuit conception. The inventive method is flexible and can be adapted to several cost functions or criteria.

The inventive method finds the best children nodes for a match of simple gates (AND, OR, NAND, NOR). The method allows one to improve the overall area of the final design while respecting the time constrains. It also allows one to smartly speed up the tiler process as this process does not have to investigate exhaustive lists of possible children. Two preferred embodiments are disclosed. One such embodiment is designed to improve slack time and the other is designed to minimize required area.

The invention therefore provides a method for converting a logic design into a logic representation based upon cells of a target library; the method comprising the steps of: a) converting said logic design into a plurality of Boolean zones; b) partitioning the Boolean zones into a set of interconnected logic cones and buffer trees; c) sorting the logic cones in a forward breadth first search order and tiling the logic cones one after another; d) selecting that part of each such logic cone having the worst slack; e) in each logic cone sorting all possible children nodes to form a pile in decreasing order of their associated slack; f) expanding the first expandable node on the pile of sorted children nodes; g) resorting the pile of nodes; and h) iteratively expanding and resorting until said representation is achieved. This method can be executed where the cells are selected from a target library comprising AND, OR, NAND and NOR gates.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which:

FIG. 1, comprising

FIG. 2 illustrates the possible matches for a node n in a logic cone;

FIG. 6, comprising FIGS. 6a and 6b, is an example of a 3-input AND logic gate configuration with two alternative implementations;

FIG. 7, comprising

DETAILED DESCRIPTION OF THE PREFERRED EMBODIMENTS

The present invention comprises method steps as follows:

1. Converting an abstract design into a plurality of Boolean zones;

2. Partitioning the Boolean zones into a set of interconnected logic cones and buffer trees;

3. Selecting that part of each such logic cone having the worst slack;

4. Sorting all possible children nodes in decreasing order of their associated slack;

5. Expanding the first expandable node on the pile of sorted children nodes; and 6. Resorting the pile of nodes.

In an alternative embodiment, for logic cones having no time constraints, the steps of the above method are based upon a different sorting criterion, namely, the number of inputs of the gates selected by the tiler with the smallest gates on top of the pile. The first stated embodiment is a timing driven node expansion and the second stated embodiment is an area driven node expansion.

Figure 1A:
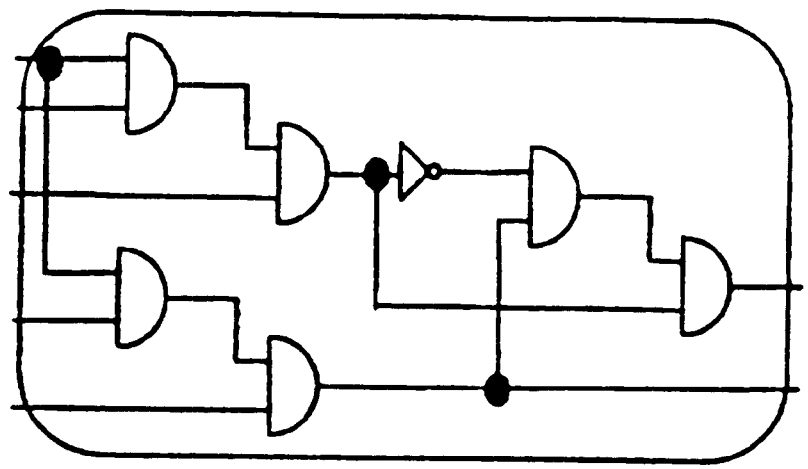
FIGS. 1a and 1b, illustrates partitioning the Boolean zone in a set of logic cones and buffer trees.
Figure 1B:
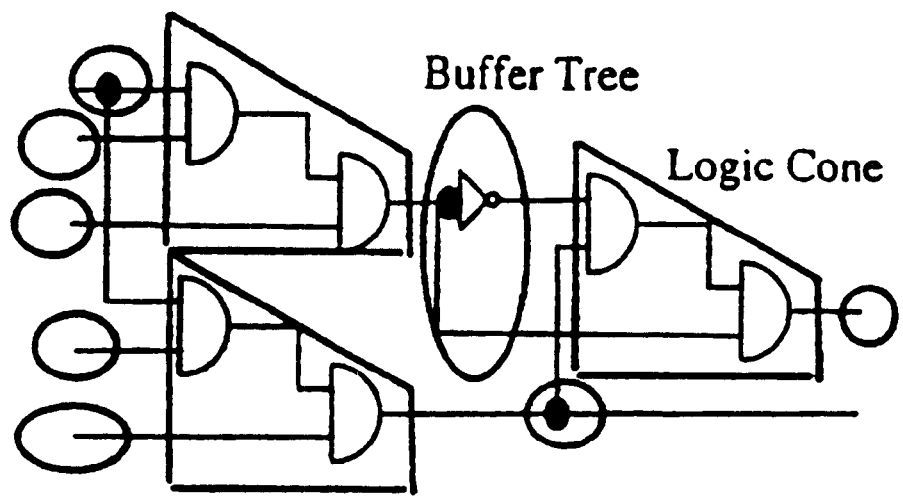
Figure 3:
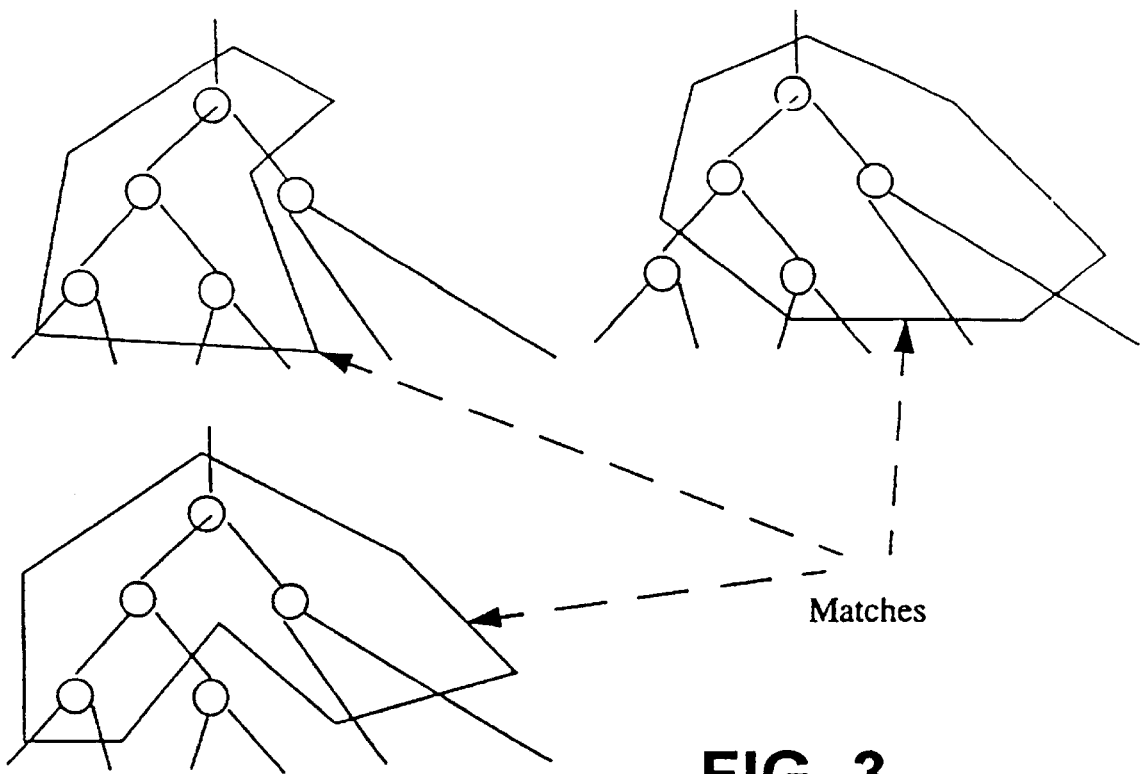
FIG. 3 illustrates three possible matches on a given node of a logic cone cell.
Figure 4:
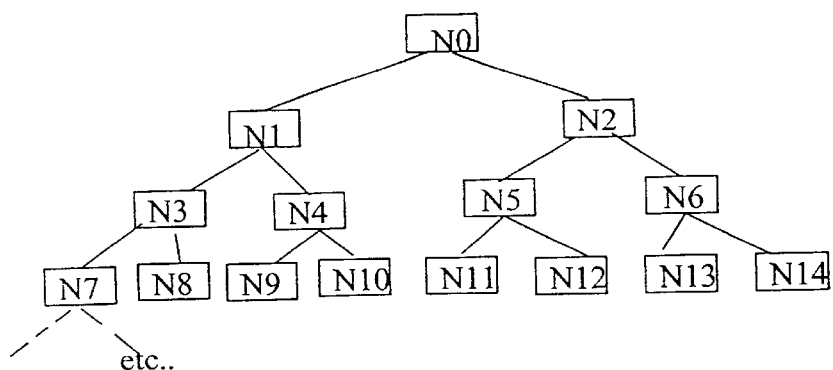
FIG. 4 is an example of an infinite binary tree used to explain the term "node expansion"
Figure 5A:
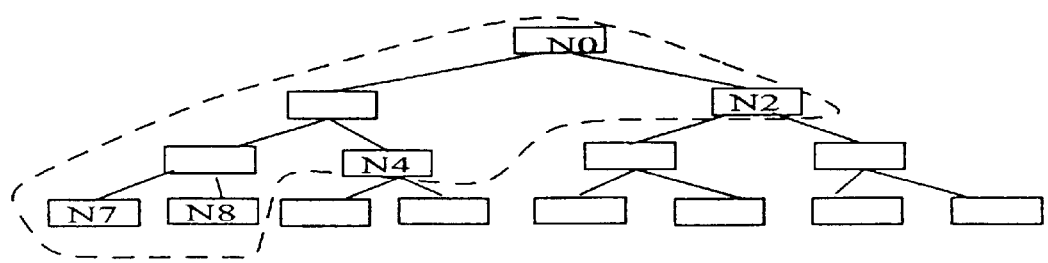
FIG. 5, comprising FIGS. 5a, 5b, 5c, 5d and 5e, provide illustrations for selecting four children from the tree of FIG. 4.
Figure 5B:
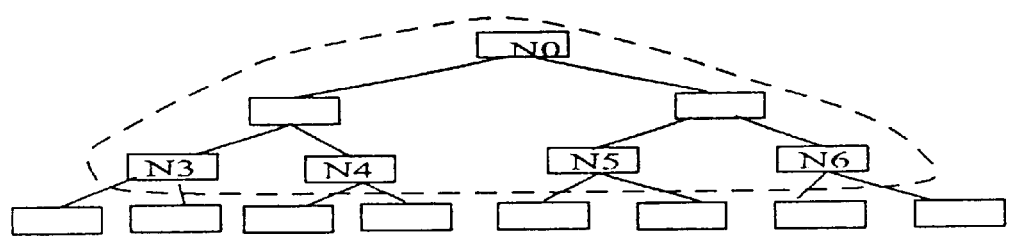
Figure 5C:
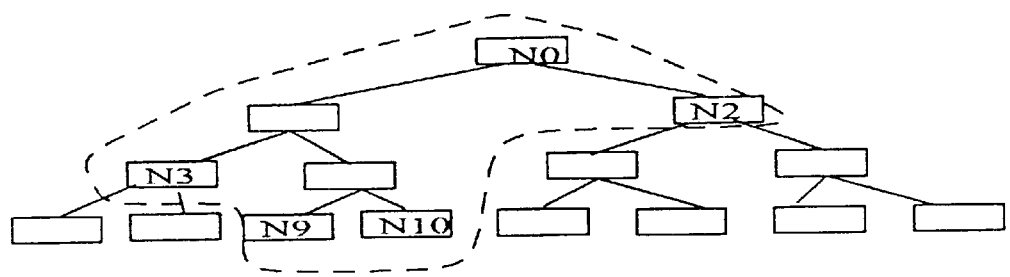

Node expansion is a process step used in the embodiments of the invention. Before either embodiment is explained, it is useful to provide an understanding of node expansion. The node expansion is the mechanism that allows selection of a subtree with a given number of children inside a given tree. Lets take the example with an infinite binary tree as shown in FIG. 4. And let's assume as an example that we want to select four children in this tree: We have the following possibilities:

(note that all other children of nodes N7 N8 N9 N10 N11 N12 N13 N14 would not be reachable).

Starting from the root gate r that has a binary tree leading to m leaf-children, we need to find n children. The way this can be done is through node 'expansion' which means replace a node by its two children, then expand recursively until we reach the desired number of children. For example the pseudo code for the left node expansion on an infinite-depth tree would be:

```
expand( root, n) {
current node=root
while (numberOfChildren!=n) {
    take the 2 children of currentNode
    numberOfChildren+1
    currentNode=Select_next_expandable node( )
}
```

If the function Select_next_expandable_node( ) is implemented to always select the left-most child, then the above pseudo code would lead to children (n7, n8, n4, n2) in our previous example. A node is expandable if it has some children. The function Select_next_expandable_node is the function that is going to be described in the paragraphs 'Timing Driven Node Expansion' and 'Area Driven Node Expansion' hereinafter.

The first embodiment relating to a timing-driven form of the invention, is described as follows:

Let's state that a timing path between node A and B will be better if the path is covered by fewer gates. This is based on the fact that:

(1) Internally interconnected transistors give better timing than externally interconnected gates.

(2) Interconnect between two gates is unpredictable and unknown until final Place and Route.

(3) For a given load, smaller gates (with less inputs) are faster than bigger gates (with more inputs).

In the example of FIG. 6a and FIG. 6b, path A to Z is better in solution (2) than in solution (1). On the other hand, time for path C to Z is better in solution (1) than in solution (2).

Figure 7A:
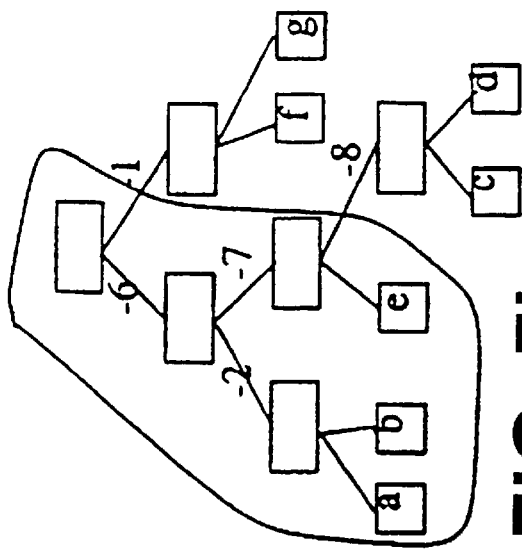
FIGS. 7a, 7b and 7c, illustrates three alternative solutions of a logic cone with timing dynamic slack information provided by the tiler.
Figure 7B:
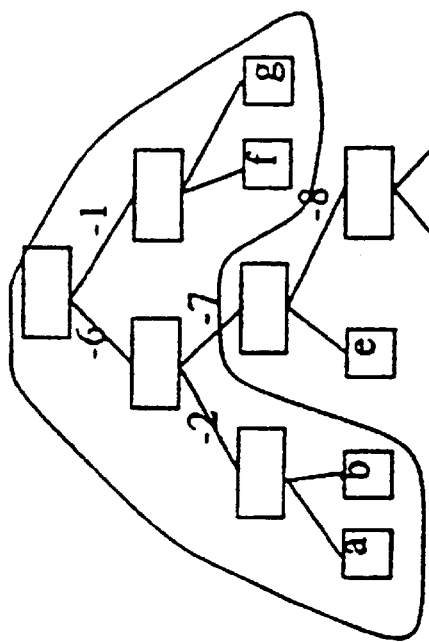
Figure 7C:
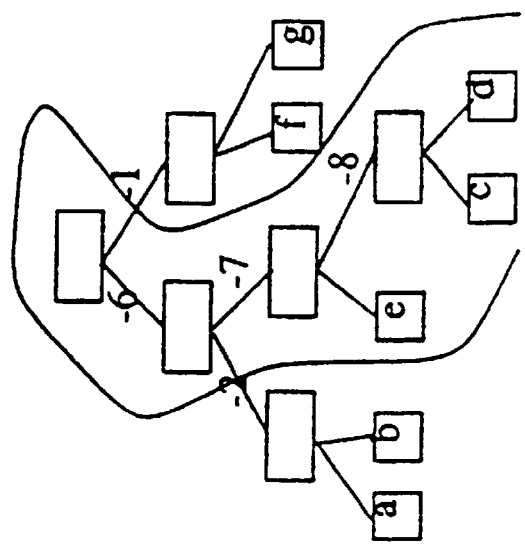

Therefore, the overall timing slack is going to be improved if we choose to 'cover' the part of the Logic Cone which has the worst slack as shown in FIGS. 7a, 7b and 7c.

Timing Driven Node Expansion

Figure 8:
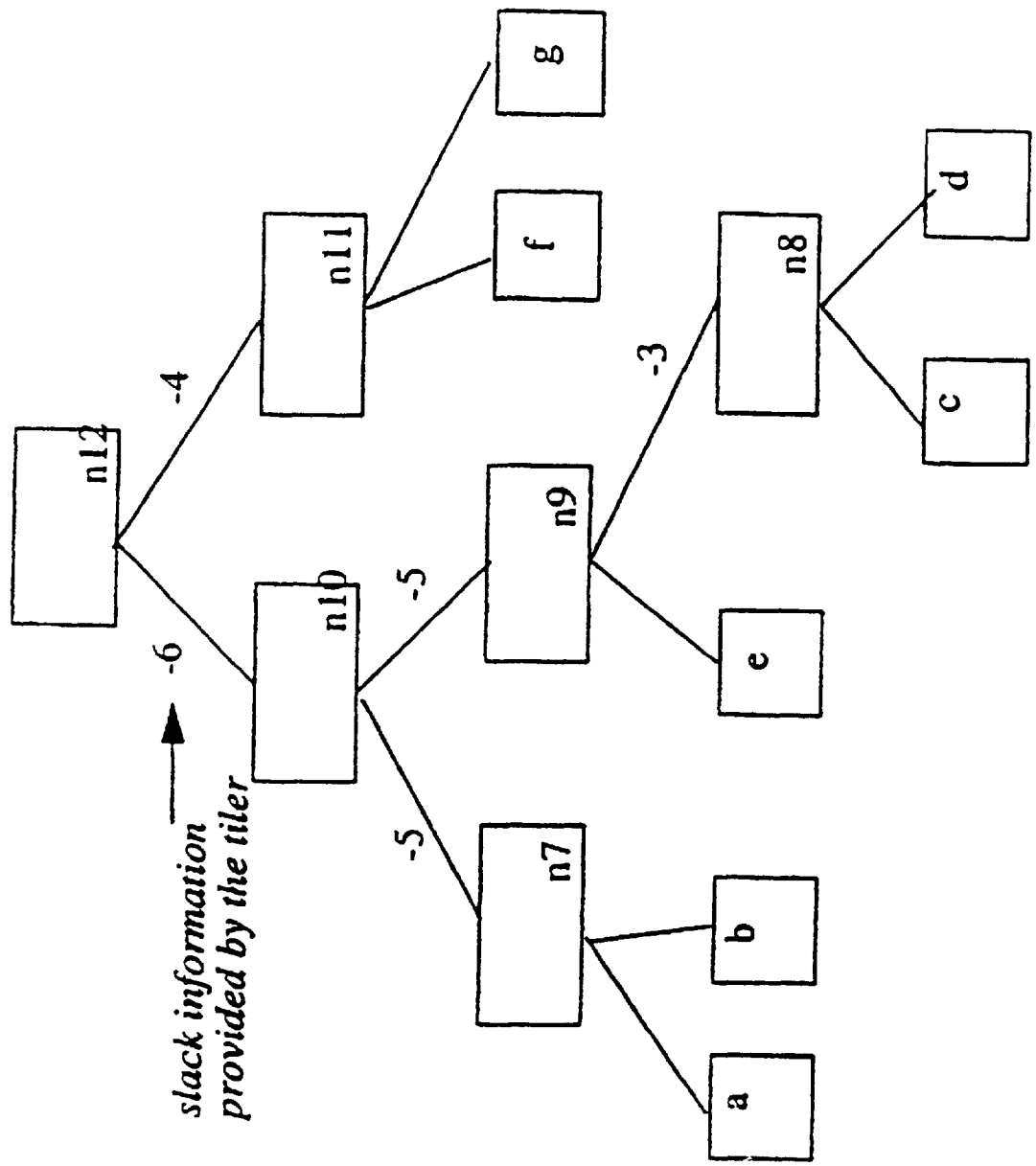
FIG. 8 is a logic cone illustration used to provide an example of the timing-based embodiment of the invention.
Figure 9:
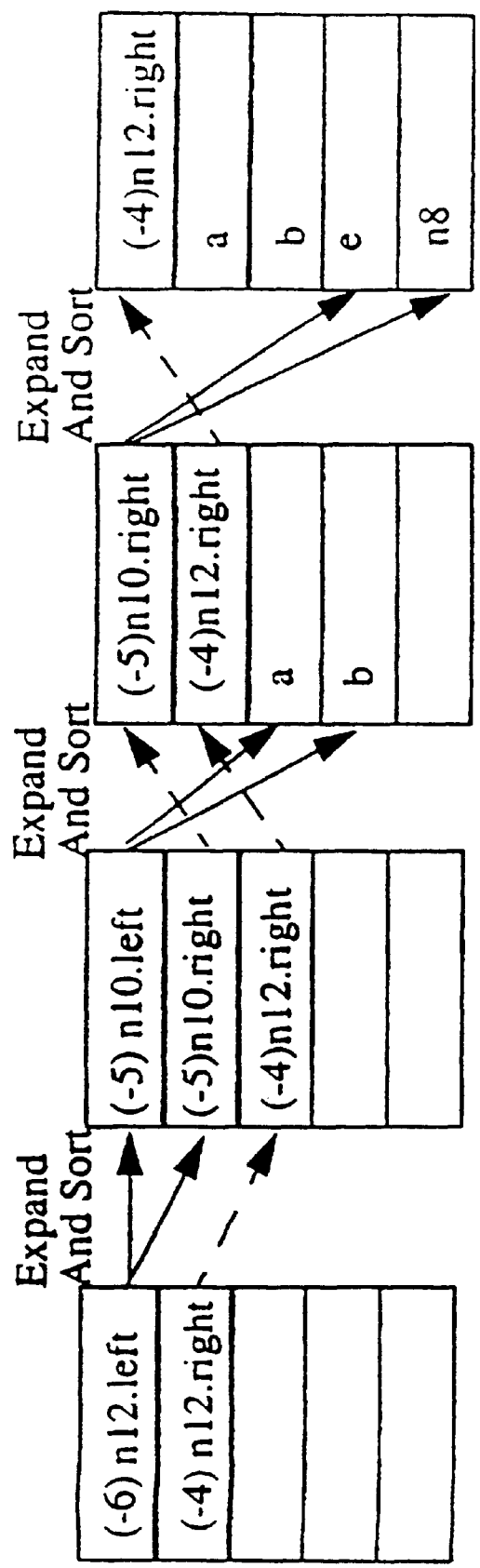
FIG. 9 is a graphical illustration of the expand and sort steps of the invention.
Figure 10:
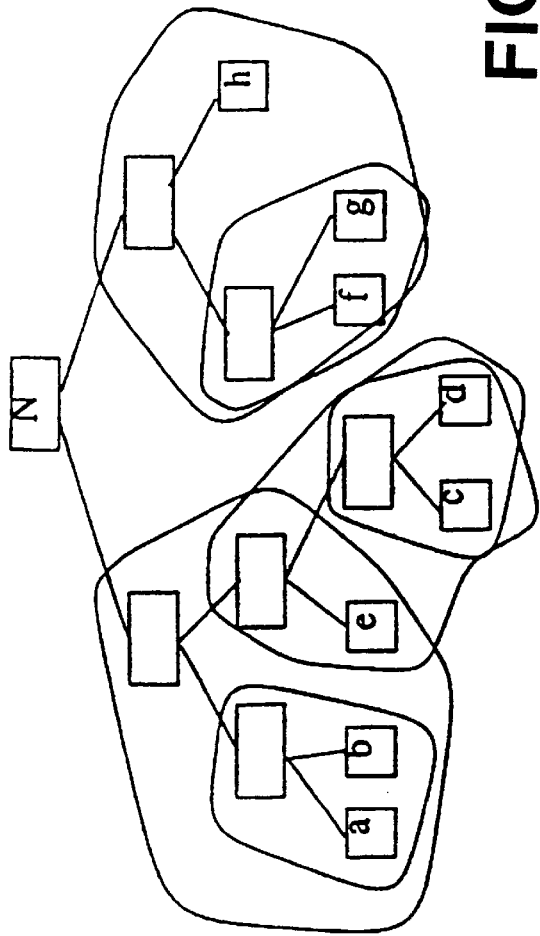
FIGS. 10–15 are logic cone illustrations used to explain the alternative or area-based embodiment of the invention.
Figure 11:
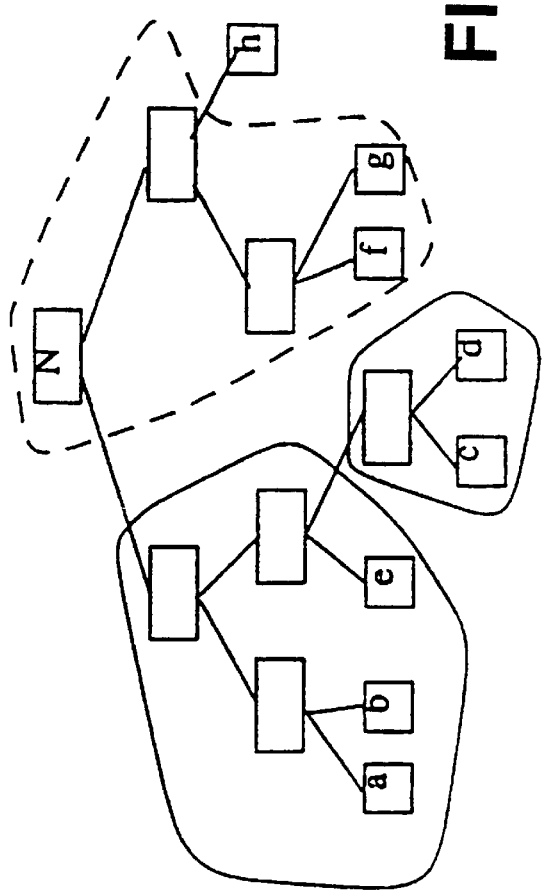
Figure 12:
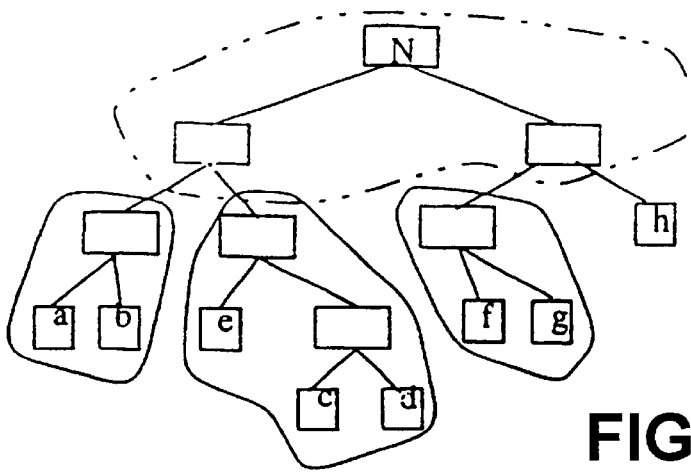
Figure 13:
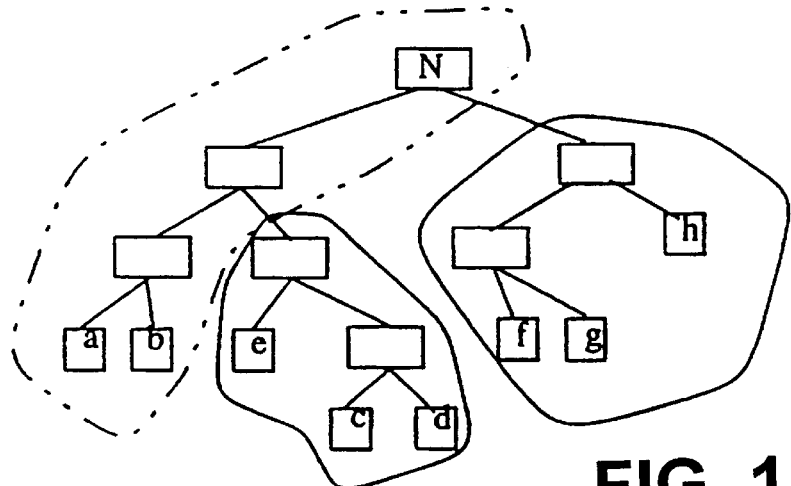
Figure 14:
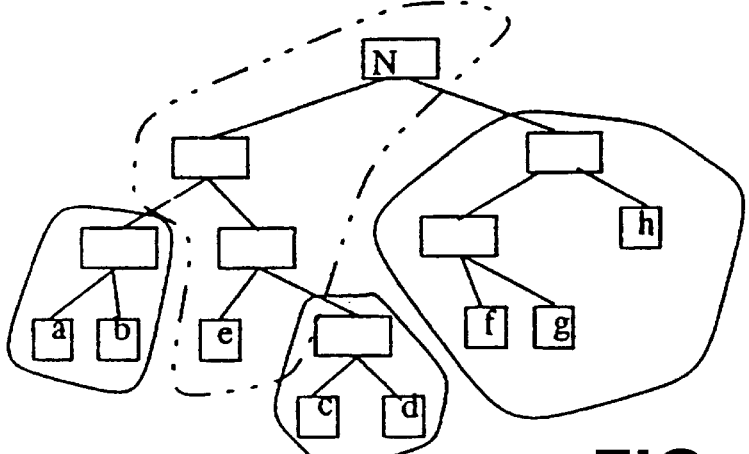

We are going to implement the children search with the help of a fixed array whose size is the size of the gate we want to match. The possible children are sorted in decreasing order of their associated slack. (Worst slack always first on the pile). Until the array is full we expand the first expandable node that we find on the pile. Each time we expand (that is: We remove that node from the stack and we add its two children), we sort the stack. FIGS. 8 and 9 illustrate this technique for one example in which we wish to match a 5 input gate. The numbers between nodes represent the slack in FIG. 8.

Pseudo-Code of the Timing Driven Node Expansion Algorithm

```
Boolean expand( ) (
while the array is not fully filled do (
    take the first expandable node of the array
        remove it from the array
        add its left child and its right child
        sort the nodes so that the worst slack is on the top of the
            array.
        expand( )
    )
    return
)
```

Area Criteria

For logic Cones that have no time constrains, or for paths where slacks are equivalent, we will try to improve the area. In order to achieve that goal we will:

prefer gates with a big cover (gates with the most inputs)
prefer a cover with as few gates as possible.

In other words, the logic cone will be well tiled (area speaking) if we find the solution with as few gates as possible (which assumes that the gates are as big as possible). Clearly, a logic cone with 8 inputs will be better tiled with an 8 input gate than with seven 2 input gates. This is illustrated in FIGS. 10–14 wherein in this example we have kept on each node the best tiling, assuming that we only have 2–3 and 4 input gates.

We assume the following area cost AND2(2), AND3(3), AND4(4) and then try to match a 4 input gate.

We can see that the first and third solutions are better than second and fourth. Therefore we need to find an algorithm that will yield the first or third solution.

Area Driven Node Expansion

Figures 15, 16:
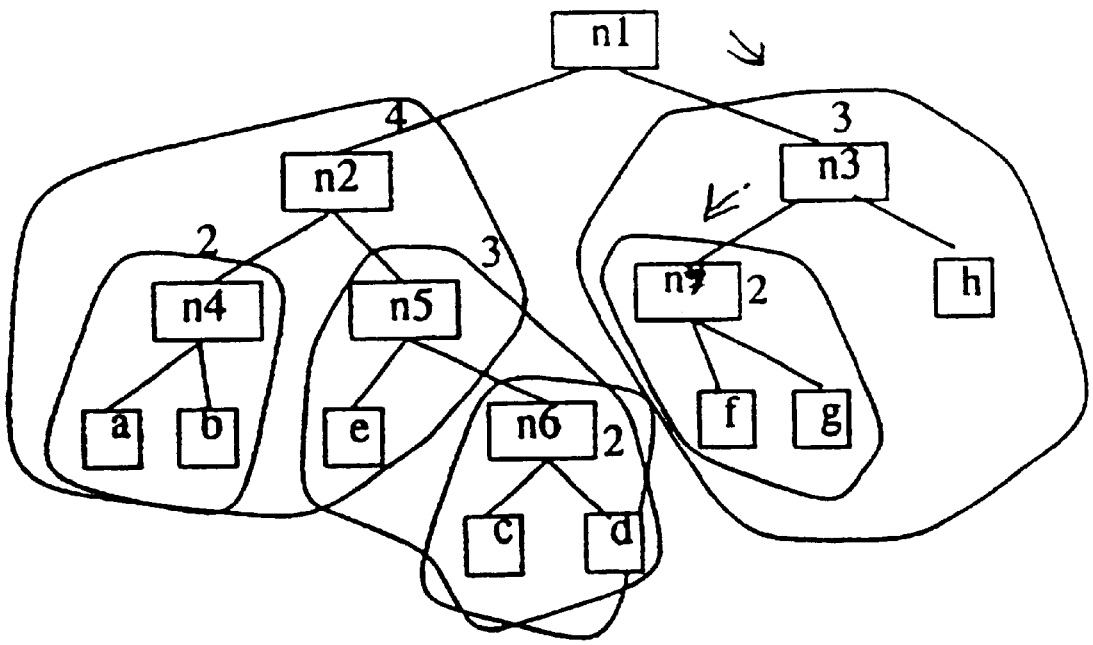
FIG. 16 is a graphical illustration of the expand and sort steps for the logic cone illustration of FIG. 15.

We will use the same node sort & expand mechanism that we described above, but this time, the sort criteria is the number of inputs of the gates selected by the tiler. This area-based sort technique is illustrated in FIGS. 15 and 16.

Pseudo-code of the Area Driven Node Expansion Algorithm

```
Boolean expand( ) (
while the array is not fully filled do (
    take the first expandable node of the array
        remove it from the array
        add its left child and its right child
        sort the nodes so that the node which is tiled with the
            smallest gates is on the
        top of the array.
        expand( )
    )
    return
)
```

Having thus described the preferred embodiments of the inventive method, it being understood that various modifications and additions are contemplated and will now be apparent to those having the benefit of the above disclosure, what is claimed is:

What is claimed is:

1. A method for converting a logic design into a logic representation based upon cells of a target library; the method comprising the steps of:

a) converting said logic design into a plurality of Boolean zones;

b) partitioning the Boolean zones into a set of interconnected logic cones and buffer trees;

c) sorting the logic cones in a forward breadth first search order and tiling the logic cones one after another;

d) selecting that part of each such logic cone having a slack which is the worst;

e) in each logic cone sorting all possible children nodes to form a pile of nodes in decreasing order of their associated slack;

f) expanding a first expandable node on the pile of sorted children nodes;

g) resorting the pile of nodes; and h) iteratively expanding and resorting until said representation is achieved.

2. The method recited in claim 1 wherein said cells are selected from a target library comprising AND, OR, NAND and NOR gates.

3. The method according to claim 1, wherein said breadth first search is performed using a fixed array having a size that matches a size of a gate that is to be matched.

4. The method according to claim 3, wherein said step of expanding comprises a timing driven node expansion.

5. The method according to claim 3, wherein said step of expanding comprises an area driven node expansion.

6. The method according to claim 1, wherein:

said breadth first search is performed using a fixed array having a size that matches a size of a gate that is to be matched; and said step of expanding comprises one of a timing driven node expansion and area driven node expansion.

7. The method according to claim 6, wherein:

said method is embodied in a set of computer instructions stored on a computer readable media;

said computer instructions, when loaded into a computer, cause the computer to perform the steps of said method.

8. The method according to claim 7, wherein said computer instructions are compiled computer instructions stored as an executable program on said computer readable media.

9. The method according to claim 6, wherein said method is embodied in a set of computer readable instructions stored in an electronic signal.

10. A method for converting a logic design into a logic representation based upon cells of a target library; the method comprising the steps of:

a) converting said logic design into a plurality of Boolean zones;

b) partitioning the Boolean zones into a set of interconnected logic cones and buffer trees;

c) sorting the logic cones in a forward breadth first search order and tiling the logic cones one after another;

d) selecting that part of each such logic cone having the fewest gates with the most inputs;

e) in each logic cone sorting all possible children nodes to form a pile of nodes in increasing order of the number of inputs of the gates of each tiled node;

f) expanding a first expandable node on the pile of sorted children nodes;

g) resorting the pile of nodes; and h) iteratively expanding and resorting until said representation is achieved.

11. The method recited in claim 10 wherein said cells are selected from a target library comprising AND, OR, NAND and NOR gates.

12. The method according to claim 10, wherein said breadth first search is performed using a fixed array having a size that matches a size of a gate that is to be matched.

13. The method according to claim 12 wherein said step of expanding comprises a timing driven node expansion.

14. The method according to claim 12, wherein said step of expanding comprises an area driven node expansion.

15. A method for converting a logic design into a logic representation based upon cells of a target library; the method comprising the steps of:

a) converting said logic design into a plurality of Boolean zones;

b) partitioning the Boolean zones into a set of interconnected logic cones and buffer trees;

c) sorting the logic cones in a forward breadth first search order and tiling the logic cones one after another;

d) selecting that part of each such logic cone having a selected criterion;

e) in each logic cone sorting all possible children nodes to form a pile of nodes in accordance with the selected criterion for selecting cells from said target library;

f) expanding a first expandable node on the pile of sorted children nodes;

g) resorting the pile of nodes; and h) iteratively expanding and resorting until said representation is achieved.

16. The method recited in claim 15 wherein said cells are selected from a target library comprising AND, OR, NAND and NOR gates.

17. The method according to claim 15, wherein said breadth first search is performed using a fixed array having a size that matches a size of a gate that is to be matched.

18. The method according to claim 17 wherein said step of expanding comprises a timing driven node expansion.

19. The method according to claim 17, wherein said step of expanding comprises an area driven node expansion.

* * * * *